(12) United States Patent
Bergmann et al.

(10) Patent No.: US 7,002,813 B2
(45) Date of Patent: Feb. 21, 2006

(54) ASSEMBLY COMPRISED OF A PANEL-LIKE CONSTRUCTED MODULE AND OF A CONNECTION UNIT, PRODUCTION METHOD AND DEVICE

(75) Inventors: Eduard Bergmann, Ludenscheid (DE); Herwig Rilling, Kamen (DE); Peter Westermayr, Bonn (DE); Clemens Hofbauer, Teuhlitz (DE); Boris Klebensberger, Karlsbad (DE); Karsten Wambach, Bräunsdorf (DE)

(73) Assignees: Leopold Kostal GmbH & Co. KG, Ludenscheid (DE); Solarworld AG, Bonn (DE)

( * ) Notice: Subject to any disclaimer, the term of this patent is extended or adjusted under 35 U.S.C. 154(b) by 352 days.

(21) Appl. No.: 10/415,267

(22) PCT Filed: Oct. 31, 2002

(86) PCT No.: PCT/EP02/12158

§ 371 (c)(1),
(2), (4) Date: Apr. 28, 2003

(87) PCT Pub. No.: WO03/041227

PCT Pub. Date: May 15, 2003

(65) Prior Publication Data
US 2004/0047118 A1 Mar. 11, 2004

(30) Foreign Application Priority Data
Nov. 7, 2001 (DE) ................. 101 54 234

(51) Int. Cl.
*H05K 7/02* (2006.01)
*H05K 3/36* (2006.01)
*B23P 19/00* (2006.01)

(52) U.S. Cl. ............. 361/807; 361/775; 361/808; 361/809; 361/812; 361/813; 29/739; 29/747; 29/760; 29/832; 29/834; 29/840; 29/854; 29/857; 29/860; 439/736

(58) Field of Classification Search .......... 361/729, 361/735, 775, 807–813; 439/736; 29/739, 29/741, 745, 747, 760, 827, 831, 832, 840–842, 29/845, 854–858, 860
See application file for complete search history.

(56) References Cited

U.S. PATENT DOCUMENTS 2,869,040 A  1/1959  Pifer (Continued)

FOREIGN PATENT DOCUMENTS

DE     89 12 914.8     11/1989

(Continued)

*Primary Examiner*—John B. Vigushin
(74) *Attorney, Agent, or Firm*—Brooks Kushman P.C.

(57) ABSTRACT

An arrangement which has a panel-like electrical/electronic module, such as a solar power module, and a connection unit which are electrically connected to one another. The module and the connection unit each have an essentially flat printed conductor structure with connecting sections. The printed conductor structures are situated in parallel planes. The connecting sections are rigid electrical conductor sections and are bent out from the planes of the printed conductor structures of the connection unit and the module. The connecting sections of the connection unit are situated corresponding to the arrangement of the connecting sections of the module so that for the connection unit connected to the module each connecting section of the module is electrically connected to a respective connecting section of the connection unit and these adjoin one another in one section situated in a different spatial position than that of the planes of the printed conductor structures.

21 Claims, 2 Drawing Sheets

U.S. PATENT DOCUMENTS

| | | | |
|---|---|---|---|
| 4,398,235 A | * 8/1983 | Lutz et al. | 361/735 |
| 5,434,749 A | 7/1995 | Nakayama | |
| 5,446,626 A | * 8/1995 | Dittmann et al. | 361/785 |
| 5,478,244 A | 12/1995 | Maue et al. | |
| 5,808,533 A | * 9/1998 | Buscher et al. | 335/202 |
| 5,847,937 A | * 12/1998 | Cepa et al. | 361/809 |
| 6,300,565 B1 | * 10/2001 | Loibl et al. | 174/52.3 |
| 6,788,547 B1 | * 9/2004 | Moden | 361/772 |

FOREIGN PATENT DOCUMENTS

| | | |
|---|---|---|
| DE | 44 32 191 C1 | 9/1994 |
| DE | 197 12 842 C1 | 3/1997 |
| EP | 0 387 845 A1 | 3/1990 |

* cited by examiner

ASSEMBLY COMPRISED OF A PANEL-LIKE CONSTRUCTED MODULE AND OF A CONNECTION UNIT, PRODUCTION METHOD AND DEVICE

BACKGROUND OF THE INVENTION

1. Field of the Invention

The invention relates to an arrangement comprising a panel-like electrical/electronic module having a flat surface with openly contactable connecting sections as part of an essentially flat printed conductor structure for the electrical connection of the module, and comprising a connection unit having electrical/electronic elements located on a printed conductor structure situated in a plane parallel to the printed conductor structure of the module and provided with means for contacting connecting sections of the module, so that the module is electrically connectable via the connection unit. The invention further relates to a connection unit for such an arrangement and to a method of producing such an arrangement. The invention further relates to a method of joining a connection unit to a panel-like module for creating such an arrangement, and to a device for joining a connection unit to a panel-like module for manufacturing such an arrangement.

2. Background Art

Panel-like electrical/electronic components are designed as solar power modules or solar power panels, for example. Such a solar power module comprises a plurality of individual solar cell arrangements which are situated behind a transparent protective layer, for example a pane of glass, with their photosensitive surface facing toward the pane of glass. These solar cells are electrically interconnected on the back side by means of printed conductor structures. The printed conductor structure used for electrically connecting the individual solar cells of such a solar power module is also used to connect the solar power module to additional solar power modules or to a network.

For this purpose, freely contactable connector sockets accommodated inside a connector socket housing are joined to corresponding connecting sections of the stamped grid so that these connector sockets can be contacted via a plug-in connector part having a complementary design. The connector socket housing having the individual freely contactable connector sockets provided as connecting sections of the stamped grid is integrated into the back covering of the solar cell arrangement. Such an arrangement also includes a connection unit which comprises a plug as a means for contacting the contact socket.

The plug itself is electrically connected with its male plug part to a printed conductor structure applied to a printed circuit board. The conventionally designed printed conductor structure is used to configure protective diodes which are necessary to prevent destruction of individual solar cells when the solar power module is partially shaded. Solar power modules must be resistant to wind and water over a period of at least 25 years. It is therefore important that the electrical junctions are protected from moisture penetration over their entire service life.

Thus, for protection of the plug-in connection the connection unit is inserted in a housing which is sealed and adhesively joined to the back covering of the solar power module. High temperatures are produced on the back side of such a solar power module, so that the connection unit and in particular the means provided for joining the connection unit to the solar power module must be correspondingly temperature-resistant. In addition, is important to ensure that the electrical/electronic components of the connection unit used, for example the protective diodes, do not become so heated during operation of the solar power module that they are destroyed. However, arrangements from the prior art do not always provide this assurance.

An electrical connection between the printed conductor structure of the connection unit and that of the module is relatively costly due to the use of plug-in connector parts. In addition, the plug-in connector part associated with the connection unit must be manually engaged in the sockets of the module. Even if a mechanical engagement of two plug-in connector parts were possible in principle, a certain overall height would be necessary for providing the plug-in connector parts. In particular for panel-like electrical/electronic modules, such as solar power modules, however, a design is desired which is as flat as possible.

SUMMARY OF THE INVENTION

Based on this discussion of the prior art, the object of the present invention is to refine an aforementioned arrangement in such a way that in particular the production of an electrical connection between the connection unit and the module can be carried out not only using simpler means, but also by mechanical means. A further object of the invention is to provide a connection unit for such an arrangement which in principle is connectable to such a module by mechanical means, thereby avoiding the problem of excessive heating of the electrical/electronic components, and to provide a method for producing and a device for manufacturing a machine-produced electrical connection between a connection unit and a module.

The object relating to the arrangement is achieved by the invention by the fact that the means for contacting the connecting sections of the module are bent out from the plane of the printed conductor structure, and a portion of the connecting sections representing the printed conductor structure and the connecting sections of the module are rigid electrical conductor sections which can be bent out of the plane of the printed conductor structure of the module, the connecting sections of the connection unit being situated corresponding to the arrangement of the connecting sections of the module, so that for the connection unit connected to the module, each connecting section of the module is electrically connected to the respective connecting section of the connection unit and these adjoin one another in one section, and in this adjoining region are situated in a different spatial position than that of the planes of the printed conductor structures.

The claimed connection unit for such an arrangement is characterized in that the printed conductor structure of the connection unit is a stamped grid, and the connecting sections of the printed conductor structure of the connection unit provided for contacting the connecting sections of the module are a part of the stamped grid. Situated on this stamped grid are the electrical/electronic components, such as diodes, and at least one connecting cable joined to the stamped grid by a jointed connection.

The object relating to the method is achieved by the features of claim 13. The object relating to the device is achieved by the features of claim 18.

With regard to the subject of the claimed arrangement, the connecting sections of the module are designed as rigid yet bendable printed conductor structure sections. Thus, for creating an electrical connection between one connecting section of the module and one connecting section of the connection unit, it is possible to lift the connecting sections of the modules, which initially lie flat on the back side of the module, from the surface by means of a lifting step, said connecting sections of the modules remaining lifted from the module surface. In this manner it is possible to make accessible by mechanical means the otherwise covered lower backside of the connecting sections of the module, in particular for producing a jointed connection to a connecting section of the connection unit.

It may be provided that the connecting sections of the connection unit are bent out from the plane of the printed conductor structure of the connection unit, thus representing a bending buttress for the connecting sections of the module. It is also possible to arrange the connecting sections of the connection unit and of the module in parallel planes with respect to one another so that these connecting sections may be bent as a unit out of their original plane. In each case, a joined unit formed from each connecting section of the module and the respective connecting section of the connection unit is situated in a different spatial position than the particular printed conductor sections, so that in principle both oppositely facing exteriors of such a joined unit are freely accessible. This other spatial position of such a joined unit may be an approximately rectangular angular piece. Also, twisting may be performed about an axis in the plane of the adjoining printed conductor structures.

The printed conductor structure for the separately claimed connection unit is formed by a stamped grid, the connecting sections provided for connecting the connecting device to the module being a part of the stamped grid. The necessary electrical/electronic components are also situated on the stamped grid. The advantage of using a stamped grid is that the electrical/electronic components can be connected to the stamped grid by a welded connection, and, in particular, that the stamped grid provides a much more uniform dissipation of heat than would be realized by the use of a printed conductor structure situated on a printed circuit board. Consequently, the stamped grid is used not only to produce the required printed conductor structure, but also as a cooling element.

In addition, the use of connecting sections as part of the printed conductor structure-forming stamped grid makes the use of additional means for connecting the connecting device to the module basically superfluous. Thus, it is possible to encapsulate the stamped grid, provided with the electrical/electronic components such as protective diodes and at least one electrical connecting cable, using a casting compound. The connecting sections provided for connecting the connection unit protrude from the casting body, which may be produced by an injection-molding process. These connecting sections may, for example, project into a window provided in the casting body. Thus, it is possible to easily encapsulate the entire connection unit. In particular when a window is furnished in which the connecting sections provided for connecting the connection unit project inward, in a second step this window may likewise be easily filled to seal against moisture penetration, for example by casting. The additional provision of a special housing to be attached to the module, therefore, is basically unnecessary.

The outer surface of the casting body encapsulating the stamped grid of the connection unit may be texturized by surface-enlarging elements, for example cooling elements, cooling fins, and the like.

A connection unit as described above may be easily affixed directly to the back side of the module. The invention is described below, using an exemplary embodiment with reference to the attached Figures.

DETAILED DESCRIPTION OF THE PREFERRED EMBODIMENT(S)

A connection unit 1 is provided for connecting a solar power module. Connection unit 1 comprises a stamped grid, designated overall by reference number 2, which forms the printed conductor structure of connection unit 1. The individual sections of stamped grid 2 are initially joined to one another by bridges B. In one configuration of stamped grid 2, bridges B are separated. Bridges B serve solely to stabilize stamped grid 2 until it is encapsulated in a casting body, using an injection-molding process.

Stamped grid 2 which serves as a printed conductor structure is used to position protective diodes D to prevent destruction of individual solar cells when the solar power module is partially shaded. In the illustrated exemplary embodiment, protective diodes D are arranged in pairs. By designing the printed conductor structure as a stamped grid 2, it is possible to make the respective areas to be contacted by one or more diodes large enough so that, depending on the desired configuration of connection unit 1, one or more diodes can be situated at each of these positions. Two connecting cables 3, 4 are also connected to stamped grid 2. Connecting cables 3, 4 and diodes D are joined to stamped grid 2 by a weld. With regard to the desired service life and the vulnerability of such a connection, a welded joint is much more durable than a soldered joint or a screwed connection, as has been used in the prior art.

Stamped grid 2 which is designed as a printed conductor structure comprises a plurality of connecting sections $A_A$ by which the connecting section of the solar power module is contacted. These connecting sections $A_A$ are bent out from the material of stamped grid 2 and from the plane of stamped grid 2 to allow an electrical connection to connecting sections of the solar power module to be made, as further described below. In the illustrated exemplary embodiment, connecting sections $A_A$ are bent out at approximately right angles from the plane of stamped grid 2.

Figure 2:
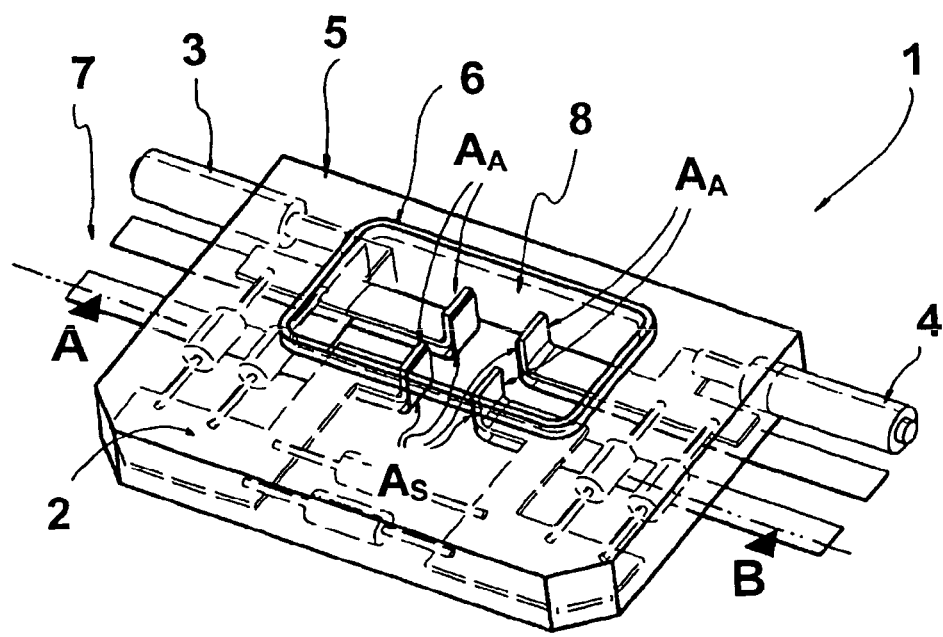
FIG. 2 shows the portion of the connection unit illustrated in FIG. 1 encapsulated in a casting body, with connecting sections of the printed conductor structure of the solar power module joined to the connection unit.

Stamped grid 2 is cast for encapsulation along with diodes D, which serve as electrical/electronic components, and the ends of connecting cables 3, 4 which are attached to the ends of stamped grid 2, and is situated in a casting body 5 as illustrated in FIG. 2. Casting body 5 is shown in schematic form in FIG. 2. The casting body may also have a textured surface for surface enlargement, such as by recreating only the raised prominences produced by the diodes. The casting body may also bear surface-enlarging elements, such as cooling ribs, to enable better cooling of connection unit 1.

FIG. 2 shows connection unit 1 with its connecting sections $A_A$ electrically connected to connecting sections $A_S$ of a solar power module 7, which for the sake of clarity is not illustrated in greater detail except for its connecting section $A_S$.

Casting body 5 is kept as flat as possible, and for protection of connecting sections $A_A$ has a casting collar 6 which encloses a window 8 into which connecting sections $A_A$ of connection unit 1 of casting body 5 project. In the exemplary embodiment illustrated, the arrangement of connecting sections $A_A$ of connection unit 1 and of connecting section $A_S$ of solar power module 7 are configured in two superposed planes. Connecting sections $A_S$ of solar power module 7 are also a part of ribbon conductors, so that they are rigid yet capable of being bent out from the plane of the solar power module.

Figure 1:
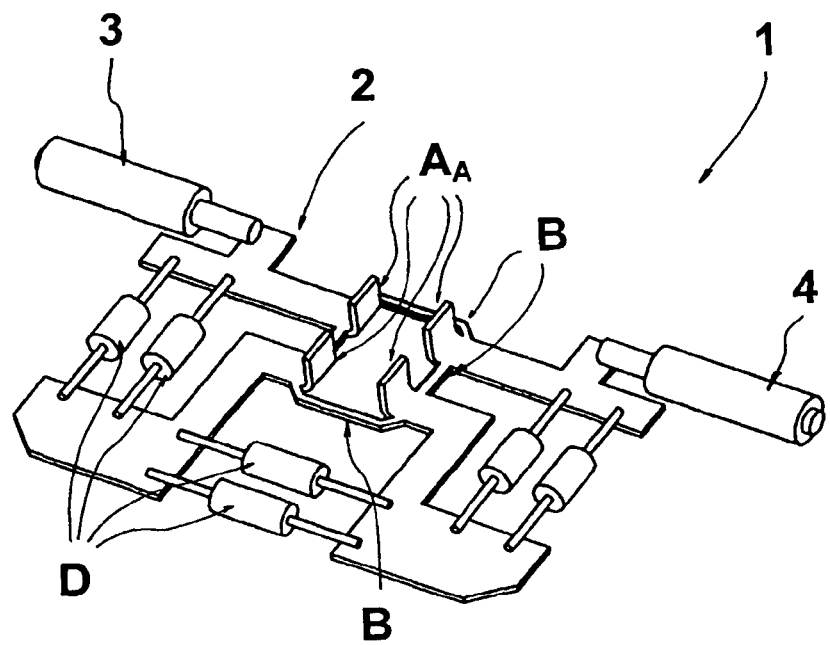
FIG. 1 shows a schematic perspective view of the printed conductor structure of a connection unit for a solar power module.

In a first assembly position, connecting sections $A_A$ and $A_S$ are superposed in different planes, whereby connecting sections $A_A$ as shown in FIG. 1 are angled away from the plane of stamped grid 2 of connection unit 1. To produce the desired welded joint between each pair of connecting sections $A_A$ and $A_S$, connecting sections $A_S$ of solar power module 7 are preferably grasped by mechanical means, such as by vacuum grippers or 'eddy current' grippers, and lifted.

It is practical if a hold-down clamp is positioned beforehand on the sections of the ribbon conductor which are not to be lifted from the plane of solar power module 7. The hold-down clamp then also acts as a bending abutment about which connecting sections $A_S$ of solar power module 7 are bent out from the plane of solar power module 7 in a subsequent step until the connecting sections contact the free exterior of connecting sections $A_A$ of connection unit 1. In this manner, connecting sections $A_S$ of solar power module 7 are brought together with connecting sections $A_A$ of connection unit 1.

For producing a jointed connection between each pair of connecting sections $A_A$ and $A_S$, the two oppositely situated exteriors of such a joined unit formed from each pair of connecting sections $A_A$ and $A_S$ are now freely available. The desired jointed connection, for example a weld, is preferably created by mechanical means, but may also be carried out manually. In principle, all assembly processes can be carried out by mechanical means, so that a solar power module 7 can then be provided with a connection unit 1 entirely by mechanical means.

In one exemplary embodiment which is not illustrated, the connecting sections of the stamped grid of the connection unit initially remain in the plane of the stamped grid and are not, as shown in FIG. 1, already bent out from the plane. In this exemplary embodiment, these connecting sections are bent out together with the connecting sections of the solar power module, and in this embodiment as well a hold-down clamp is used as a bending abutment.

Before connecting sections $A_S$ are bent out, connection unit 1 is attached to the back side of solar power module 7. For the attachment of connection unit 1 to the back side of solar power module 7 it is useful to first create a rapidly bonding connection, using an adhesive, for example, between the two elements so that the electrical connection between connecting sections $A_A$ and $A_S$ can be made essentially immediately after placing connection unit 1 on the back side of the solar power module.

For this purpose, the underside of connection unit 1 in the illustrated exemplary embodiment has individual adhesive domed projections so that with a small contact area it is possible to achieve such a rapid attachment by using a so-called super glue. In addition, connection unit 1 on the back side of solar power module 7 is circumferentially connected, using a slow-curing adhesive or adhesive tape which withstands high stress over the service life of the arrangement formed by connection unit 1 and solar power module 7.

Figure 3:
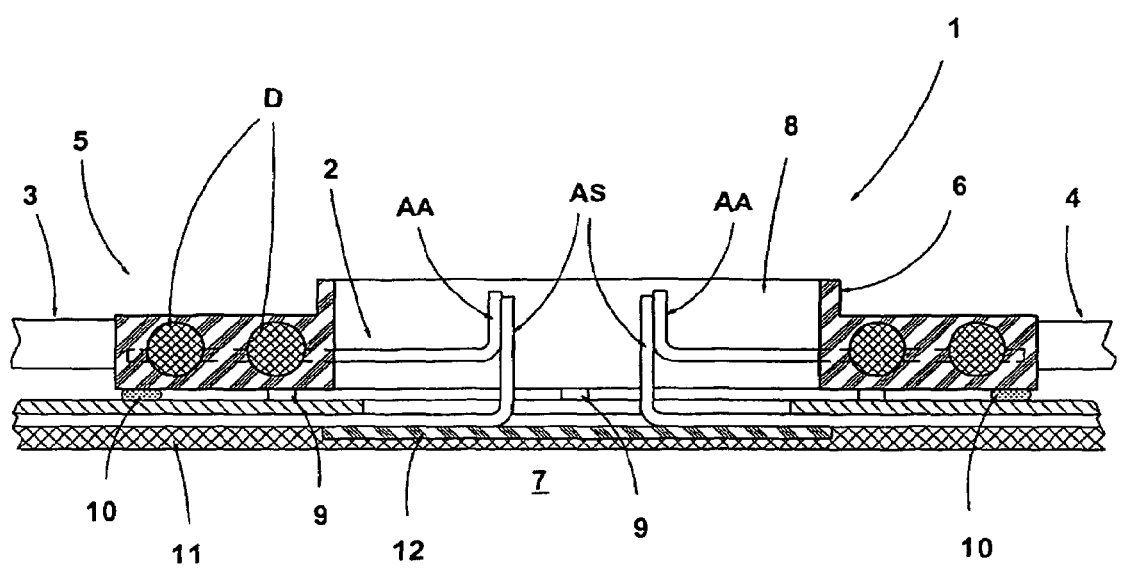
FIG. 3 shows a section through the arrangement of FIG. 2 along line A–B.

The arrangement of connection unit 1 on the back side of solar power module 7 can be seen in the sectional illustration in FIG. 3. The described adhesive domed projections 9 and adhesive ring 10 are also shown.

The design of the back side of solar power module 7 can also be seen in FIG. 3, in particular the arrangement of connecting conductors $A_S$. The ribbon conductors are basically joined to the other parts by an adhesive layer 11. These ribbon conductors are separated from adhesive layer 11 by a separating film 12 only in the region of connecting sections $A_S$ of the ribbon conductors, thus enabling connecting sections $A_S$ to be easily lifted from separating film 12. In the exemplary embodiment illustrated, separating film 12 acts as a separating layer. Other separating means may be used instead, such as a separating powder, a separating wax, or the like.

Separating film 12 meets the requirements for weather and temperature resistance by the arrangement. The separating film may be a UV-stable polyester film, for example. Separating film 12 also has guides into which connecting sections $A_S$ are inserted so that the latter are laterally guided or held to a certain extent during bending. These guides are not shown in FIG. 3 for the sake of clarity.

The connecting sections of the connection unit may also have a shoulder piece on each end to compensate for the difference in height between the two planes of the stamped grid.

The use of a stamped grid 2 as a printed conductor structure has the additional advantage that very good heat distribution, and therefore cooling, is possible on account of the material used and the amount of material. Moreover, the use of a stamped grid allows the components provided to be varied for producing various connection units. Furthermore, a stamped grid contained within a casting body does not need to be additionally enclosed by a junction box, which—as is the case for the prior art—prevents heat dissipation and promotes the accumulation of heat inside the junction box. Also, in the described connection unit, and correspondingly in the described arrangement, there are fewer electrical junctions.

The described design has a very flat construction, which is likewise desirable. On the upper side of the casting body additional cable holders may be positioned in which connecting cables 3, 4, which are provided on each end with a plug-in connector part, are initially held. This advantageously simplifies an electrical connection during testing of the arrangement formed from connection unit 1 and solar power module 7. Such a cable holder may be connected to the casting body via a rupture joint which is removable after assembly of the arrangement, such as on a building roof.

A device for providing a solar power module 7 with a connection unit 1 comprises a holder for holding solar power module 7. A positioning device is provided which is movable with respect to fixed solar power module 7, by which connection unit 1 may be positioned in relation to solar power module 7 and moved into its proper position. This allows connection unit 1, for example, to be optimally positioned.

In such a case, a target marker may be placed in the region of open connecting conductor $A_S$ of solar power module 7. Before connection unit 1 is actually positioned on the back side of solar power module 7, adhesive points, and also adhesive ring 10 for forming an enclosing connection, are applied to the points of mechanical contact on the back side of solar power module 7 by means of adhesive domed projections 9 on connection unit 1.

The device also comprises an apparatus for grasping, lifting, and bending connecting sections $A_S$ of solar power module 7. This is preferably performed in two successive passes, whereby in a first, the bending step connecting sections $A_S$ of solar power module 7 are lifted by vacuum grippers high enough from separating film 12 so that the connecting sections remain lifted from the surface of separating film 12.

In a next step, connecting sections $A_S$ are actually bent against the already angled connecting sections $A_A$ of connection unit 1. For this purpose the device comprises a number of vacuum grippers corresponding to the number of connecting sections $A_S$ to be bent. Bending against connecting sections $A_A$ of the connection unit may be achieved, for example, by a spreading tool which is inserted between oppositely facing connecting sections $A_S$, and used to simultaneously bend all connecting conductors $A_S$.

The device also comprises a forked hold-down clamp which prevents the ribbon conductor sections remaining in the plane of solar power module 7 which adjoin connecting sections $A_S$ from being lifted from the back side of solar power module 7. The device also comprises a welding robot for producing the desired joint connections between each pair of connecting sections $A_A$ and $A_S$.

In a further embodiment, the stamped grid for the connection unit along with its connecting sections is first connected to the connecting sections of the printed conductor structure of the module, and the stamped grid is then encapsulated as a whole on the back side of the module, using a casting compound. In such a design, encapsulation and joining of the connection unit to the module are achieved in a single pass, the electrical connections created between the module and the connection unit being encapsulated as well.

What is claimed is:

1. Arrangement comprising:
    a panel-like electrical/electronic module having a flat surface with openly contactable connecting sections which are part of an essentially flat printed conductor structure for the electrical connection of the module, the printed conductor structure of the module being situated in a plane; and
    a connection unit having electrical/electronic elements located on an essentially flat printed conductor structure situated in a plane parallel to the plane of the printed conductor structure of the module and having means for contacting the connecting sections of the module so that the module is electrically connectable via the connection unit;
    wherein the means for contacting the connecting sections of the module include connecting sections which are part of the printed conductor structure of the connection unit, the connecting sections of the connection unit are bent out from the printed conductor structure of the connection unit at an angle relative to the planes of the printed conductor structures such that the connecting sections of the connection unit are non-parallel with the planes of the printed conductor structures, the connecting sections of the connection unit and the connecting sections of the module are rigid electrical conductor sections, the connecting sections of the module are bent out from the printed conductor structure of the module at an angle relative to the planes of the printed conductor structures such that the connecting sections of the module are non-parallel with the planes of the printed conductor structures, the connecting sections of the connection unit being situated corresponding to the arrangement of the connecting sections of the module so that for the connection unit connected to the module each connecting section of the module is electrically connected to a respective connecting section of the connection unit and these adjoin one another in one section situated in a different spatial position than that of the planes of the printed conductor structures.

2. Arrangement according to claim 1 wherein: the connecting sections are ribbon conductors.

3. Arrangement according to claim 1 wherein: the connecting sections of the module are situated in a window of an insulating covering of the module.

4. Arrangement according to claim 1 wherein: the printed conductor structure of the connection unit is a stamped grid, and the connecting sections of the printed conductor structure of the connection unit are a part of the stamped grid, and situated on this stamped grid are the electrical/electronic components and at least one connecting cable, each of which is joined to the stamped grid by a jointed connection.

5. Arrangement according to claim 1 wherein: the printed conductor structure of the connection unit with the exception of the connecting sections of the connection unit is encapsulated in a casting body.

6. Arrangement according to claim 5 wherein: the connecting sections of the connection unit are situated so as to project into a window in the casting body.

7. Arrangement according to claim 5 wherein: an outer surface of the casting body has surface-enlarging elements.

8. Arrangement according to claim 1 wherein: the module is a solar power module.

9. Arrangement according to claim 1 wherein: the printed conductor structure of the connection unit is an essentially flat stamped grid situated in a plane, and the connecting sections of the printed conductor structure of the connection unit are a part of the stamped grid, and situated on the stamped grid are the electrical/electronic components and at least one connecting cable.

10. Arrangement according to claim 9 wherein: the connecting sections of the printed conductor structure are bent out from the plane of the stamped grid.

11. Arrangement according to claim 9 wherein: the stamped grid with the exception of the connecting sections are encapsulated in a casting body.

12. Arrangement according to claim 11 wherein: the connecting sections of the printed conductor structure are situated so as to project into a window in the casting body.

13. Arrangement according to claim 11 wherein: the outer surface of the casting body has surface-enlarging elements.

14. Method of joining a connection unit to a panel-like electrical/electronic module, the connection unit having an essentially flat printed conductor structure having connecting sections, the module having openly contactable connecting sections which are part of an essentially flat printed conductor structure for the electrical connection of the module, the method comprising the following steps:
    positioning the connecting sections of the connection unit in an adjoining superposed or contiguous arrangement with the connecting sections of the module, each connecting section of the connection unit together with a connecting section of the module forming a joined unit,
    grasping the connecting sections of the module,
    lifting off the connecting sections of the module from the surface of the module,
    bringing the connecting sections of the module together with the connecting sections of the connection unit so that the joined units are then situated in a different spatial position, and the surface of the connecting sections of the module, originally situated underneath the module and inaccessible, is freely accessible for producing a jointed connection for joining each connecting section of the module to a connecting section of the connection unit, and joining each of the connecting sections of the connection unit and the module to form a joined unit by means of a jointed connection.

15. Method according to claim 14 wherein:

the step of grasping the connecting sections of the module is carried out using vacuum grippers.

16. Method according to claim 14 wherein:

the step of positioning the connection unit on the module includes joining the connection unit to the module so that the connection unit and the module form a concrete object for the subsequent steps.

17. Method according to claim 16 wherein:

the connection unit is joined to the module by means of a two-step adhesive connection, whereby in the first adhesive step a rapid and sufficiently stable attachment for carrying out the subsequent process steps is provided, and a further adhesive step cures more slowly and over the service life assures a proper connection between the connection unit and the module.

18. Device for joining a connection unit to a panel-like module for producing an arrangement, the connection unit having an essentially flat printed conductor structure having connecting sections, the module having openly contactable connecting sections which are part of an essentially flat printed conductor structure for the electrical connection of the module, the device comprising:

a holding unit for attaching the module for the duration of the joining process, a movable positioning device for positioning the connection unit with respect to the module, means for grasping the connecting sections of the module, means for bending the connecting sections lifted off from the surface of the module for bringing these connecting sections together with the connecting sections of the connection unit, a hold-down system by which sections of the module remaining in their original position on the printed conductor structure are held down, and a welding device by which each of the connecting sections of the connection unit and the module are welded together.

19. Device according to claim 18 further comprising:

at least one adhesive dispensing device by which adhesive for attaching the connection unit to the module may be distributed at predetermined positions on the back side of the module.

20. Device according to claim 18 wherein:

the means for grasping the connecting sections of the module are vacuum grippers.

21. Device according to claim 18 wherein:

the means for bringing the connecting sections together with the connecting sections of the connection unit are spreading means.

* * * * *